US 6,711,072 B2

(12) United States Patent
Fischer et al.

(10) Patent No.: US 6,711,072 B2
(45) Date of Patent: Mar. 23, 2004

(54) DIGITAL MEMORY CIRCUIT HAVING A PLURALITY OF MEMORY AREAS

(75) Inventors: Helmut Fischer, Oberhaching (DE); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/266,355

(22) Filed: Oct. 7, 2002

(65) Prior Publication Data

US 2003/0067821 A1 Apr. 10, 2003

(30) Foreign Application Priority Data

Oct. 5, 2001 (DE) .......................................... 101 49 099

(51) Int. Cl.[7] ................................................ G11C 7/00
(52) U.S. Cl. ....................... 365/190; 365/202; 365/203; 365/203.03
(58) Field of Search ................................. 365/202, 203, 365/230.03, 190

(56) References Cited

U.S. PATENT DOCUMENTS

| | | | | |
|---|---|---|---|---|
| 5,126,970 A | * | 6/1992 | Ul Haq .................. | 365/154 |
| 5,973,983 A | * | 10/1999 | Hidaka .................. | 365/230.03 |
| 6,147,925 A | * | 11/2000 | Tomishima et al. .... | 365/230.03 |
| 6,172,918 B1 | | 1/2001 | Hidaka .................. | 365/189.11 |
| 6,351,419 B1 | * | 2/2002 | Dietrich et al. ........ | 365/189.04 |

* cited by examiner

*Primary Examiner*—Son Luu Mai
(74) *Attorney, Agent, or Firm*—Laurence A. Greenberg; Werner H. Stemer; Gregory L. Mayback

(57) ABSTRACT

A memory circuit contains areas having memory cells. To transfer memory data from/to the memory cells, two-wire local data lines are provided. Each of the local data lines is associated with one of the memory areas and is connected to a two-wire master data line, common to all the memory areas, by a line circuit-breaker. To represent the binary value of data on a local data line, the wires are driven, to first and second logic potentials. Each line circuit-breaker contains switching devices which, if one of the two wires in the local data line is at the second logic potential, autonomously transfer the potential to the associated wire in the master data line, and, if one of the two wires in the master data line is at the second logic potential, autonomously transfer the potential to the associated wire in the local data line.

5 Claims, 3 Drawing Sheets

DIGITAL MEMORY CIRCUIT HAVING A PLURALITY OF MEMORY AREAS

BACKGROUND OF THE INVENTION

Field of the Invention

The invention relates to a digital memory circuit which contains at least two areas having a respective multiplicity of memory cells, disposed in a matrix form in rows and columns, for storing a respective binary data item. For each column, a primary sense amplifier is provided for sensing the data item stored in an addressed cell and for using a transfer switch which can be turned on by a column selection signal to connect a first wire in a two-wire local data line associated with the primary sense amplifier in question to a first logic potential and to connect a second wire in the local data line to a second logic potential when the sensed data item has the first binary value, and to connect the first wire to the second logic potential and to connect the second wire to the first logic potential when the sensed data item has the second binary value. Each local data line can be connected by a respective line circuit-breaker to a two-wire master data line which is associated with a respective local data line for each area in the memory bank and is routed to the input connections of a secondary sense amplifier individually associated with it. Precharging devices are provided for temporarily equalizing both wires in all the local data lines to a potential situated between the first and second logic potentials and for temporarily equalizing both wires in all the master data lines to the first logic potential before a transfer switch is turned on. A preferred but not exclusive area of application for the invention is DRAM memories.

In digital data stores, the binary memory cells in each memory bank are frequently combined into a plurality of separate areas which each have a dedicated set of sense amplifiers, each of which is responsible for a subset of the cells in the area in question. Normally, the cells in each memory area form a matrix containing rows and columns, and each column has an associated sense amplifier. Each sense amplifier is connected by an associated bit line to all the memory cells in the column in question. Each row can be selectively addressed by activating an associated word line. The corresponding activation signal is derived in a word line decoder (row decoder) from the row address for the memory cell that is to be read. The result of activation is that each cell in the row in question communicates its memory content to the sense amplifier that is associated with the column in question, and the sense amplifier then generates an amplified signal that represents the binary value of the stored data item. This representation is then transferred, by turning on a transfer switch individually associated with the sense amplifier, to an associated local data line which can be connected by a line circuit-breaker to an associated master data line which is common to all the memory areas in the bank, in order to transfer the binary representation to a secondary sense amplifier and to amplify it there for the purpose of outputting the data item.

The transfer switches are controlled by column selection signals that are derived by a column decoder from the column address for the memory cells that are to be read. The column selection signals are supplied to all the memory areas together.

In many cases, particularly in large memory banks having a very large number of columns in each memory area, the total number n of columns in each area is split into m adjacent groups, each of which contains k=n/m columns and occupies a corresponding segment in the memory area. Accordingly, the local data lines are also segmented. Each group (that is to say each segment) can in turn be split into p adjacent subgroups, each of which contains q=k/p columns, with all the transfer switches associated with the sense amplifiers in the same subgroup being respectively actuated by a common column selection signal associated with the subgroup. In order to forward the data transferred by the q transfer switches in the same respective subgroup separately from one another in such cases, each segment has q local data lines provided along it, each of which is connected to precisely one individually assigned transfer switch for each subgroup of the columns in the segment in question. If q=1, a dedicated column selection signal is generated for each column and hence for each transfer switch.

In line with the number m of segments, m bundles of master data lines are provided. Each of the bundles contains q master data lines associated with the q local data lines of a respective segment in all the memory areas.

Normally, the bit lines, the local data lines and the master data lines are two-wire lines. In this regard, each primary sense amplifier is configured to have a symmetrical output. If a memory cell content which a primary sense amplifier senses corresponds to a data item with the first binary value, the output of the amplifier produces a potential difference whose polarity indicates the binary value of the data item stored in the cell. If the cell content corresponds to a data item with the first binary value, then one output connection of the amplifier changes to a first defined logic potential and the other output connection changes to a second defined logic potential. If the cell content corresponds to a data item with the second binary value, then the two logic potentials on the output connections of the amplifier appear the other way round. By virtue of the transfer switch being turned on when the line circuit-breaker is on, the output potentials of the sense amplifier are applied to the wires in the associated local data line and arrive, via the line circuit-breaker, on the wires in the associated master data line, so that they produce a potential difference there which represents the sensed data item. The secondary sense amplifier is therefore in the form of a differential amplifier having a symmetrical input. All the supply potentials of the primary and secondary sense amplifiers are symmetrical around the center between the two logic potentials and are close to one or the other logic potential.

In the quiescent state of the memory circuit, before a read or write mode is initiated, the wires in all the bit lines are equalized to a particular potential which is normally situated centrally between the two logic potentials. The wires in all the local data lines are likewise equalized to this potential, specifically for the following reason: during subsequent column selection, the selected transfer switches are, of course, on not just in that memory area which contains the activated word line, but also in all the other memory areas whose bit lines have all retained the equalization potential. The aforementioned equalization of the local data lines to the potential results in that unnecessary charging currents are avoided in the other memory areas.

In the quiescent state of the memory circuit, the wires in all the master data lines are likewise equalized to a particular potential. For the second-mentioned equalization potential, one of the two logic potentials is chosen, specifically that which corresponds or comes close to the load-side supply potential of the secondary sense amplifier. This is because the amplifier then remains in the linear region of the amplifier characteristic curve when the input connections are actuated using the aforementioned potential difference representing the sensed data item.

Upon initiation of a read or write mode, the wires in all the bit lines and local data lines are isolated from the source of the associated equalization potential, so that the wires in those instances of the lines which are selected for access can assume the data-specific potential differences.

In memory circuits based on the prior art, each line circuit-breaker is a two-terminal switch having an external control connection for applying a turn-on signal which turns on the switch and keeps it on for the duration of this signal. All line circuit-breakers associated with the same memory area are controlled together in the prior art. Since the row address for an addressed memory cell also identifies the respective memory area, a line circuit-breaker selection device based on the prior art operates on the basis of the row address decoded in the word line decoder in order to transfer the turn-on signal simultaneously to all the line circuit-breakers in the memory area which contains the addressed row.

The aforementioned turn-on signal for the line circuit-breakers requires a relatively large amount of current, particularly when it is "boosted", that is to say is operated at increased voltage, in accordance with the customary prior art. In addition, in the described cases of segmentation of the individual memory areas in the prior art, a large amount of current is required for charge reversal on the local data lines. This is because when the line circuit-breakers in a memory area are turned on, which normally occurs before transfer switches in the memory area in question are turned on, both wires in all the local data lines of all the segments of the memory area in question first change from their equalization potential, which is situated centrally between the two logic potentials, to the equalization potential for the master data lines, which is the same as one of the logic potentials. To this end, the source of the equalization potential for the master data lines needs to deliver a large amount of charging current.

SUMMARY OF THE INVENTION

It is accordingly an object of the invention to provide a digital memory circuit having a plurality of memory areas that overcomes the above-mentioned disadvantages of the prior art devices of this general type, which has a reduced current consumption during operation of the memory circuit.

With the foregoing and other objects in view there is provided, in accordance with the invention, a digital memory circuit. The memory circuit includes at least one memory bank containing at least two areas having a respective multiplicity of memory cells, disposed in a matrix form in rows and columns, for storing binary data. Primary sense amplifiers are provided, and one of the primary sense amplifiers is provided for each of the columns for sensing the binary data stored in an addressed memory cell. Two-wire local data lines each having a first wire and a second wire, are provided. Transfer switches are provided, and a respective transfer switch is connected between a respective two-wire local data line and a respective primary sense amplifier. The respective transfer switch receives and is turned on by a column selection signal. The respective primary sense amplifier uses the respective transfer switch to connect the first wire in the respective two-wire local data line to a first logic potential and to connect the second wire to a second logic potential when a sensed data item has a first binary value, and to connect the first wire to the second logic potential and to connect the second wire to the first logic potential when the sensed data item has a second binary value. Two-wire master data lines are provided and each have a first wire and a second wire and are associated with the respective two-line local data line for each of the areas of the memory bank.

Line circuit-breakers are used, and a respective line circuit-breaker is connected between the respective two-line local data line and a respective two-wire master data line.

Secondary sense amplifiers are used and have inputs connected to the two-wire master data lines. Precharging devices are connected to and temporarily equalize the first and second wires in all of the two-wire local data lines to a potential situated between the first and second logic potentials and for temporarily equalizing the first and second wires in all of the two-line master data lines to the first logic potential before the transfer switches are turned on. Each of the line circuit-breakers contain switching devices for sensing electrical potentials appearing on the first and second wires in the respective two-wire local data line and in the respective two-wire master data line and, depending on a sensing result, if one of the first and second two wires of the respective two-wire local data line is at the second logic potential, the respective line circuit-breaker transfers the second logic potential to an associated one of the first and second wires of the two-wire master data line, and if one of the first and second wires of the respective two-line master data line is at the second logic potential, the respective two-line master data line transfers the second logic potential to an associated one of the first and second wires of the respective two-wire local data line.

The inventive configuration of the line circuit-breakers thus ensures that the line circuit-breakers are turned on autonomously, without the need for external control voltages, only on those local data lines which are used to effect a write or read mode. In the event the memory areas have a segmented configuration, the charging current consumption from the source of the equalization potential for the master data lines is lower than in conventional practice, because not all of the local data lines in the memory area in question are charged to the equalization potential for the master data lines, but rather only the local data lines of the selected segments. Since it is not necessary to apply any external actuating voltages for the line circuit-breakers, there is no longer any current consumption for this purpose, which results in a savings on current is also achieved in the case of unsegmented memory areas.

In accordance with an added feature of the invention, the switching devices of each of the line circuit-breakers further contain a first field effect transistor having a channel connected between the first wire of the respective two-line local data line and the first wire of the respective two-wire master data line and a gate connected to the second wire of the respective two-wire local data line. A second field effect transistor is provided and has a channel connected between the second wire of the respective two-wire local data line and the second wire of the respective two-wire master data line and a gate connected to the first wire of the respective two-wire local data line. A third field effect transistor is provided and has a channel connected between the first wire of the respective two-wire local data line and the first wire of the respective two-wire master data line and a gate connected to the second wire of the respective two-wire master data line. A fourth field effect transistor is provided and has a channel connected between the second wire of the respective two-wire local data line and the second wire of the respective two-wire master data line and a gate connected to the first wire of the respective two-wire local data line. The first, second, third and fourth field effect transistors have a conductivity type such that the first, second, third and fourth field effect transistors transfer the second logic potential when the gate is at the first logic potential.

In accordance with an additional feature of the invention, wherein and depending on the sensing result, if one of the first and second wires of the respective two-wire master data line is at the first logic potential, the switching devices contained in each of the line circuit-breakers transfer the first logic potential to an associated one of the first and second wires of the respective two-line local data line.

In accordance with a further feature of the invention, the switching devices of each of the line circuit-breakers further contain a fifth field effect transistor having a channel connected between the first wire of the respective two-wire local data line and the first wire of the respective two-line master data line and a gate connected to the second wire of the respective two-line master data line. A sixth field effect transistor is provided and has a channel connected between the second wire of the respective two-wire local data line and the second wire of the respective two-wire master data line and a gate connected to the first wire of the respective two-wire master data line. The fifth and sixth field effect transistors are of a further conductivity type being opposite the conductivity type of the first, second, third, and fourth field effect transistors.

In accordance with a concomitant feature of the invention, the columns in each of the areas of the memory bank form at least two adjacent groups, and each of the at least two adjacent groups occupies a separate segment of a respective area. Each of the two-wire local data lines is associated with precisely one of the segments of precisely one area of the memory bank. Each of the two-line master data lines is associated with precisely one segment of each area of the memory bank.

Other features which are considered as characteristic for the invention are set forth in the appended claims.

Although the invention is illustrated and described herein as embodied in a digital memory circuit having a plurality of memory areas, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
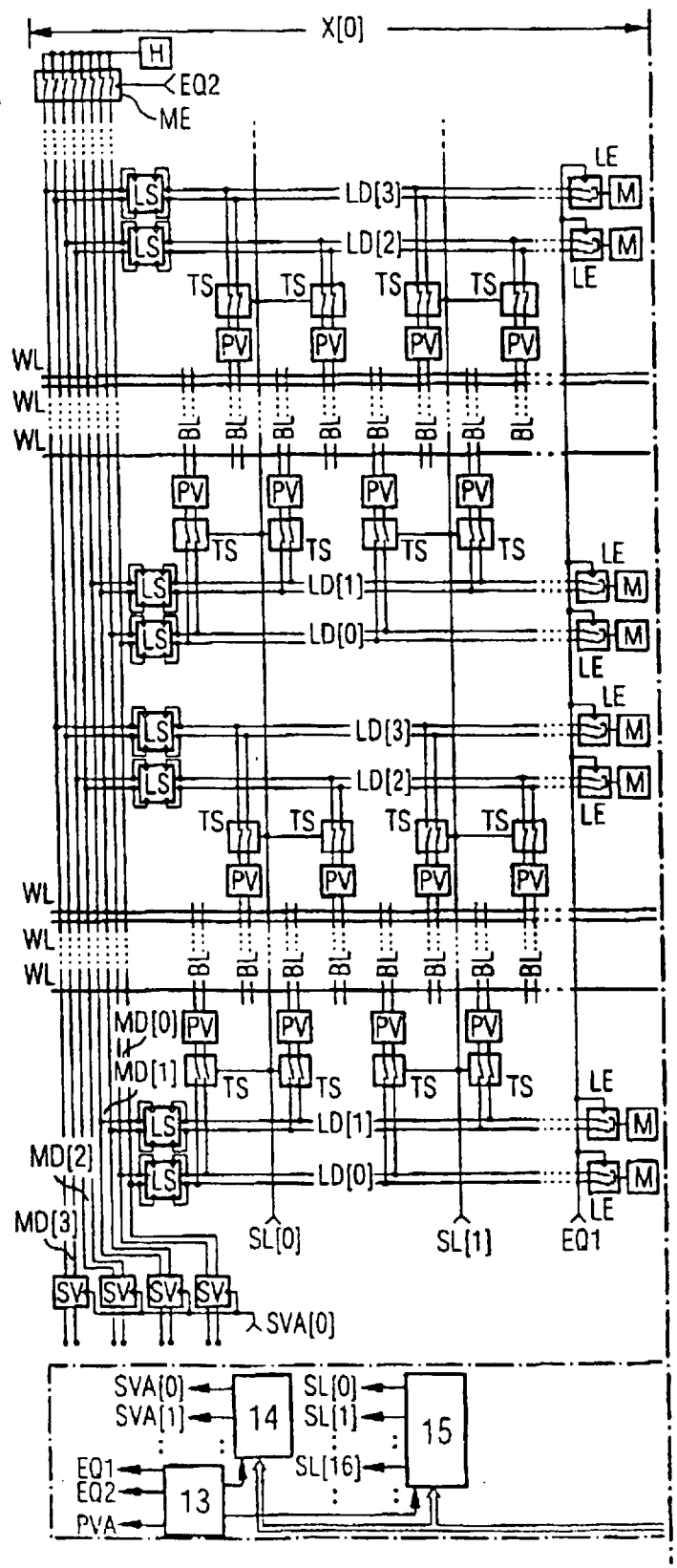
FIGS. 1A and 1B are fragmentary, block circuit diagrams of an example of a configuration of a memory circuit having a plurality of segmented memory areas according to the invention.

In the drawing and in the description below, similar elements are denoted using the same abbreviations in capital letters, followed by consecutive numbers in brackets [ ] for the purpose of more precise identification. A colon between two numbers should be read as the word "to". Thus, by way of example, "SL[0:15]" should be read as "SL[0] to SL[15]".

The following convention also applies. The two logic potentials are denoted by H (for "high") and L (for "low"). H and L are defined limit or threshold values on both sides of a potential range, a center of which is denoted as M potential. If the description states that a circuit point changes to or is at H or L potential, then the potential "at least" reaches the threshold value in question. For the circuit example shown in FIGS. 1A, 1B and 2, it can be assumed that H is positive with respect to L.

Figure 1B:
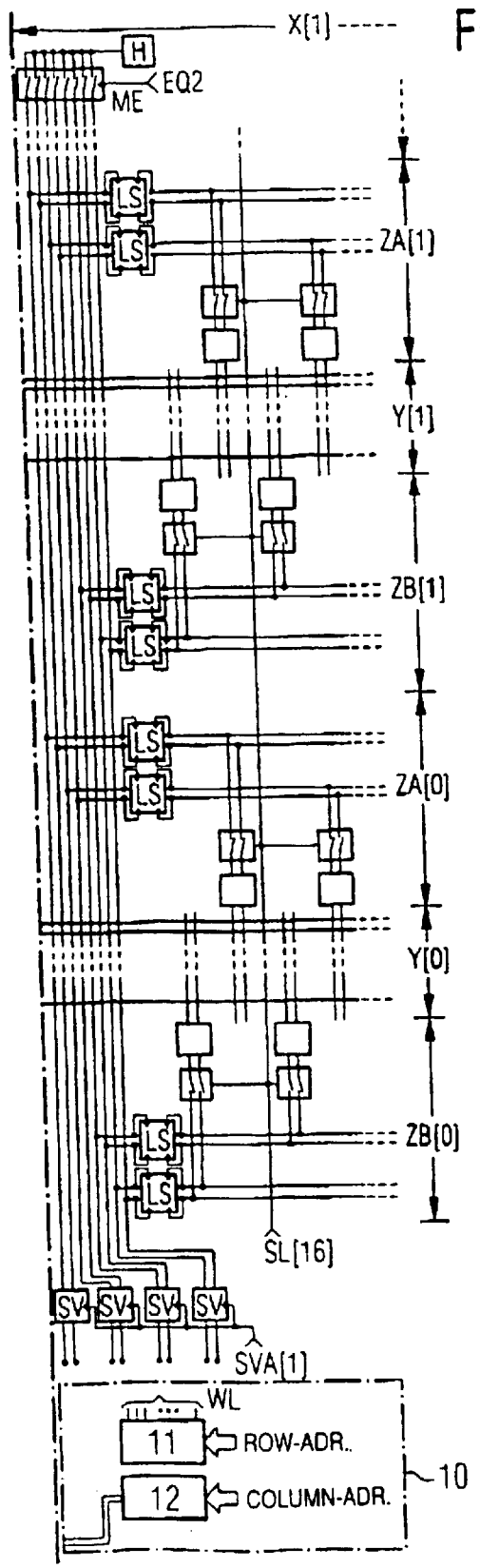

FIGS. 1A and 1B show two memory areas Y[0] and Y[1] in a DRAM memory circuit in fragmentary form. Each of the memory areas Y[0], Y[1] contains a multiplicity of memory cells which are disposed in a matrix form in rows and columns. Each row has an associated word line WL running along it, and each column has an associated two-wire bit line BL running along it. Close to every crossover between a word line WL and a bit line BL there is a non-illustrated memory cell.

The two memory areas Y[0] and Y[1] shown are part of a memory bank which also contains more of such areas, e.g. a total of eight, which are disposed so as to run away in the column direction. The diagrammatic illustration could thus be continued a corresponding distance upward. Each memory area forms a plurality m of similar segments, e.g. a total of sixteen, in the row direction. For reasons of space, the drawing shows only the first two segments X[0] and X[1] in fragmentary form. The diagrammatic illustration could thus be continued a corresponding distance to the right.

Extending along the two edges of each memory area which run transversely with respect to the column direction is a respective strip-shaped zone ZA and ZB, which hold the access circuits for the columns in the memory area in question. The configuration and number of the access circuits are the same for all the segments in each memory area, which results in that it is sufficient for the time being to describe only the access circuits in the first segment X[0] in the first memory area Y[0].

The access circuits contain, for each column, a primary sense amplifier PV, whose input is connected to the wires in the bit line BL in question, and a downstream two-terminal transfer switch TS. In each case, q=4 adjacent columns form a subgroup, and the q=4 transfer switches TS in each subgroup are controlled via a common column selection line SL. As an example, it will be assumed that each memory area has n=1024 columns, that is to say a total of 1024/4= 256 subgroups, split into m=16 segments, each of which thus contains 64 columns or 16 column subgroups. Accordingly, there are a total of 256 column selection lines SL[0:255]. The four transfer switches TS in the first subgroup in the first segment X[0] are controlled via a column selection line SL[0], the transfer switches in the second subgroup in the first segment X[0] are controlled via the column selection line SL[1], etc. The first subgroup in the second segment X1 has the associated column selection lines SL[16], etc., up to the last subgroup in the last segment, which has a non-illustrated associated column selection line SL[255].

For each segment, q=4 two-wire local data lines LD[0:3] are provided which extend in the zones ZA and ZB transversely with respect to the column direction. Each of the local data lines LD is connected to an output of a respective one of the four transfer switches TS in each subgroup. The local data lines LD[0:3] are routed via individually assigned line circuit-breakers LS to q=4 master data lines MD[0:3], which for their part are routed to q=4 secondary sense amplifiers SV.

For each segment of a memory area, there is a dedicated bundle of four respective master data lines MD[0:3], the bundle extending in the column direction via all the memory areas and being routed to four dedicated sense amplifiers SV. Each bundle is respectively associated with precisely one segment of each memory area. In a similar manner, the column selection lines SL also extend in the column direction via all the memory areas, and each of the lines SL is respectively associated with precisely one column subgroup in each of the memory areas.

Both wires in all the local data lines LD and in all the bit lines BL can be connected by equalization switches LE and BE (the latter are not shown in FIG. 1), which can be actuated together by a first equalization signal EQ1, to a first equalization potential M, which is situated as precisely as possible between the two logic potentials L and H. All the master data lines MD also have equalization switches ME provided on them which can be turned on together by a second equalization signal EQ2 in order to connect both wires in all the master data lines MD to a second equalization potential, which is the same as one of the two logic potentials—in the case shown is the same as the H potential.

Figure 2:
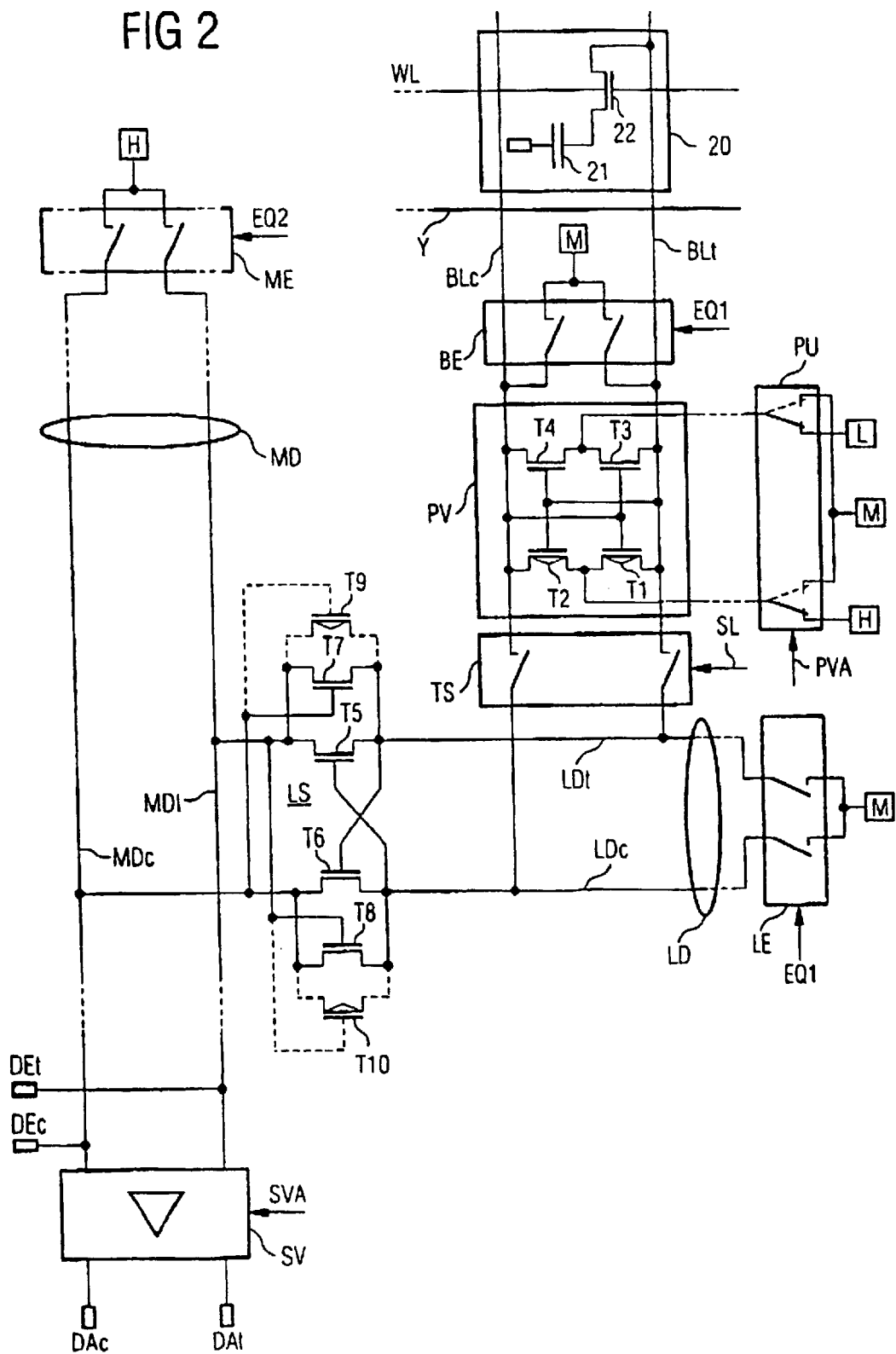
FIG. 2 is a circuit diagram of a data signal path between a memory cell and a secondary sense amplifier using a detailed illustration of a line circuit-breaker according to the invention.

To illustrate the configuration and action of the primary sense amplifiers PV and the line circuit-breakers LS shown as blocks in FIGS. 1A and 1B, FIG. 2 shows an enlarged and detailed illustration of a detail from FIG. 1, containing a memory cell 20, e.g. from the memory area Y[0], and the data transfer path between the memory cell 20 and the governing secondary sense amplifier SV. In addition, the switching elements for precharging or equalizing the data lines are also shown.

The memory cell 20 shown in FIG. 2 contains a capacitance (capacitor) 21 which forms the actual memory element and whose charge state represents the binary or data value "1" (charged) or "0" (uncharged). One side of the storage capacitor 21 is connected to a fixed potential, and the other side is connected to one of the two wires in the associated two-wire bit line BL via a channel of a selection transistor 22 in the form of an N-FET. A gate of the selection transistor 22 is connected to the associated word line WL. In line with the normal use of language, one of the wires is referred to as the "True" bit line wire BLt, and the other of the wires is referred to as the "Complement" bit line wire BLc. In the case shown, the selection transistor 22 is attached to the True bit line wire BLt, like the selection transistors for all the other cells on the same word line WL. From word line to word line, the manner in which the selection transistors are connected alternates between True and Complement bit line wires.

The access circuit, connected to the bit line wires BLt and BLc, for the column in question in the memory area contains, in accordance with FIG. 2, the associated primary sense amplifier PV having a symmetrical input and a symmetrical output. The sense amplifier PV contains a first transistor pair, containing two p-channel field effect transistors (P-FETs) T1 and T2, and a second transistor pair, containing two n-channel field effect transistors (N-FETs) T3 and T4. These and also other field effect transistors, described further below, are preferably metal oxide field effect transistors, "MOSFETs".

The source electrodes of the P-FETs T1 and T2 are coupled together at a circuit point which forms the positive supply connection for the sense amplifier PV and to which H potential or M potential can be selectively applied via the first branch of a two-terminal changeover switch PU. The source electrodes of the N-FETs T3 and T4 are coupled together at a circuit point which forms the negative supply connection for the sense amplifier PV and to which L potential or M potential can be selectively applied via the second branch of the changeover switch PU. The changeover switch PU is common to all the primary sense amplifiers PV in at least the memory area in question, and is controlled by a primary amplifier activation signal PVA.

The drain electrodes of the transistors T1 and T3 and the gate electrodes of the transistors T2 and T4 are connected to the bit line wire BLt, and can also be connected to the local data line wire LDt via a first branch of the two-terminal transfer switch TS. In a similar manner, the drain electrodes of the transistors T2 and T4 and the gate electrodes of the transistors T1 and T3 are connected to the bit line wire BLc, and can also be connected to the local data line wire LDc via the second branch of the transfer switch TS.

Each of the two wires LDt and LDc in the local data line LD can be connected to the associated wire MDt or MDc in the governing master data line MD via an associated branch of the line circuit-breaker LS. The first branch governs the connection for the true wires LDt and MDt and contains two N-FETs T5 and T7 whose channels are connected in parallel with one another between LDt and MDt, a gate of T5 being connected to the complement wire LDc, and a gate of T7 being connected to the complement wire MDc. The second branch governs the connection for the complement wires LDc and MDc and contains two N-FETs T6 and T8 whose channels are connected in parallel with one another between LDc and MDc, a gate of T6 being connected to the true wire LDt, and a gate of T8 being connected to the true wire MDt.

The secondary sense amplifier SV, to which the two wires MDt and MDc in the master data line MD are connected, is a differential amplifier which, in the exemplary embodiment shown, has a symmetrical output, that is to say two data output connections DAt and DAc, and is on when an activation signal SVA is active. Two data input connections DEt and DEc used for writing data are connected to the wires MDt and MDc in the master data line MD without involving the secondary sense amplifier SV.

The text below explains the interaction between the various elements in the data path shown in FIG. 2 when a data item is read and written from/to the memory cell 20.

During a quiescent state of the memory circuit, a primary amplifier activation signal PVA is inactive, which results in that the supply connections for all the primary sense amplifiers PV are kept at M potential via the changeover switch PU, and the amplifiers PV are thus in the floating state. The secondary amplifier activation signals SVA are also inactive, which results in that all the secondary sense amplifiers SV are off. The equalization signals EQ1 and EQ2 are active, which results in that all the bit lines BL and all the local data lines LD are at M potential, and all the master data lines MD are at H potential. In addition, all the transfer switches TS are kept off in the quiescent state, which results in that each of the amplifiers PV are isolated from the associated local data line LD.

To initiate cell access, EQ1 is made inactive in order to turn off the equalization switches BE and LE and hence to isolate the bit line wires BLt and BLc and the wires LDt and LDc in the local data line LD from the M potential. Nevertheless, the inherent capacitance of the lines results in that both wires in all the bit lines BL and in all the local data lines LD remain at M potential. The signal EQ2 is still kept active for the time being, which results in that both wires in all the master data lines MD are still driven to H potential. As previously, all the line circuit-breakers LS remain off in this situation, specifically for the following reason: the gates of the N-FETs T5 and T6 receive M potential, which is more negative than the H potential and thus keeps the transistors off. Although the N-FETs T7 and T8 are on as a result of their gate voltage, they do not transfer the H potential from the wires MDt and MDc in the master data line MD to the wires in the local data line LD, because N-FETs (particularly those of MOS design) can only effectively transfer voltages in the range from L to H/2, for example (unless their gate is "boosted" for transfer as in the prior art, i.e. is actuated using an increased gate potential which is more positive than H).

In that case, the word line WL is activated, i.e. is connected to H potential, so that the selection transistor 22 turns on. If the cell 20 has been charged, that is to say stores the binary value "1", there is a small increase in potential on the bit line wire BLt above the M potential, which results in that BLt becomes positive with respect to BLc. In contrast, if the cell 20 has not been charged, that is to say stores the binary value "0", there is a small drop in potential on the bit line wire BLt below the M potential, which results in that BLt becomes negative with respect to BLc.

A short time later, the signal PVA is made active. This turns on the sense amplifier PV by virtue of it now receiving its full supply potentials L and H. If there has been an increase in potential on BLt, then the transistors T1 and T4 are driven in the direction of increasing conductivity and the transistors T2 and T3 are driven in the direction of increasing blockage, which results in that BLt is pulled in the direction of H potential and the other bit line wire BLc is pulled in the direction of L potential. The positive feedback between T1 and T4 and between T2 and T3 and the negative feedback between T1 and T2 and between T3 and T4 results in that this operation is sped up and results in the final state being locked. If, by contrast, BLt has become negative with respect to BLc at the instant at which the sense amplifier becomes active, then the opposite final state is obtained, in which BLt is pulled to L and BLc is pulled to H. The potential difference L–H or H–L ("dissociated" in the respective final state) between the bit line wires BLt and BLc is transferred back to the memory cell, whose stored information is refreshed in this manner.

The control described up to now takes place simultaneously in all the primary sense amplifiers PV for the memory area in question, which results in that the sense amplifiers associated with the other columns have also been activated. It is now possible to connect a selected subgroup of the primary sense amplifier PV to the associated secondary sense amplifiers SV via the local data lines LD and the master data lines MD for a read or write mode. To this end, the associated transfer switches TS are turned on by the column selection signal on the associated column selection line SL. No later than at this time, the equalization switches ME for the master data lines are turned off by virtue of the signal EQ2 being removed, which results in that the wires MDt and MDc in all the master data lines are decoupled from the source of the H potential.

When the transfer switch TS at the output of a primary sense amplifier PV is turned on, the potential difference, "dissociated" in the manner described, on the bit line wires BLt, BLc is coupled to the associated local data line wires LDt, LDc, which were connected to M potential in the quiescent state by the equalization switch LE and kept this potential even when this switch had been turned off.

If the data item in the accessed memory cell has the binary value "1", the turning on of the transfer switch TS changes the local data line wire LDt from the M potential to H potential, and LDc changes from M potential to L potential. To output the read data item to the data output connections DAt and DAc on the secondary sense amplifier SV, the amplifier needs to be actuated by the local data line LD via the associated line circuit-breaker LS and the associated master data line MD. For writing, a potential difference corresponding to the information which is to be written needs to be coupled onto the bit line wires from the data input connections DEt and DEc via the master data line MD, the line circuit-breaker LS, the local data line and the transfer switch TS. If this information is the same as the previous stored information, the switching state of the sense amplifier PV does not change in any way. If the new information is the opposite binary value (opposite potential difference), for example, then the sense amplifier PV needs to be toggled into the other switching state. First, the rest of the read mode procedure will be explained, however.

The change on the local data line wire LDt from M potential to H potential turns on the N-FET T6 in the line circuit-breaker LS for the data line in question and causes it to transfer the L potential held by the primary sense amplifier PV on the local data line wire LDc to the wire MDc in the master data line MD. At the same time (or shortly beforehand or shortly afterwards), the activation signal SVA is made active for the associated secondary sense amplifier SV, which results in that the amplifier is turned on and, in line with the known characteristic of differential amplifiers, pulls the output connection DAc to L potential and pulls the output connection DAt to H potential. As a result, the read data information "1" is available in stable fashion on the output connections DAt and DAc.

When a "0" is read on the memory cell, LDt changes to L and LDc changes to H, so that the N-FET T5 in the line circuit-breaker LS turns on. This changes the secondary sense amplifier to that state in which it draws the wire MDc and the connection DAc to H potential and draws the wire MDt and the connection DAt to L potential. As a result, the read data information "0" is available in stable fashion on the connections DAt and DAc.

The write mode will first be explained with reference to the exemplary situation in which the reading of a "1" described above is intended to be followed directly by the writing of a "0" to the memory cell which has previously been read. To this end, an external write signal source with a low internal resistance puts the data input connection DEc to H potential and puts the data input connection DEt to L potential, so that MDc is brought to H potential and MDt is brought to L potential. This turns on the N-FET T7 in the line circuit-breaker LS and causes it to transfer the L potential from the wire MDt to the wire LDt. This toggles the primary sense amplifier PV, via the turned-on transfer switch TS, into that switching state in which it puts the bit line wire BLc to H potential and puts the bit line wire BLt to L potential. This causes a "0" to be written to the memory cell 20.

If, by contrast, the reading of a "0" is to be followed by the writing of a "1" to the same memory cell, then the data input connection DEt is put to H potential and the data input connection DEc is put to L potential, so that MDt is brought to H potential and MDc is brought to L potential. This turns on the N-FET T8 in the line circuit-breaker LS and causes it to transfer the L potential from the wire MDc to the wire LDc. This toggles the primary sense amplifier PV, via the turned-on transfer switch TS, into that switching state in which it puts the bit line wire BLt to H potential and puts the bit line wire BLc to L potential. This causes a "1" to be written to the memory cell 20.

In general, the line circuit-breakers LS can be produced using any desired circuit configuration which transfers the equalization potential opposite logic potential, when the logic potential appears on one of the two wires in the local data line at the potential, to the associated wire in the master data line and which transfers the logic potential, when it appears on one of the two wires in the master data line, to the associated wire in the local data line. This is because to transfer a binary data item from a data transmitter via a two-wire line to a data receiver, it is not absolutely necessary for both wires to be driven to opposite logic potentials by the data transmitter itself. As soon as the receiver "learns" which of the two wires has been driven to a particular logic potential (e.g. to the L potential), it has sufficient information about the binary value of the data item.

During the write mode, the primary sense amplifier PV is the data receiver. When a new data item is being written, if it differs from the previous data item, the amplifier needs to be toggled from the previous state to the other state, as mentioned. The previously described embodiment of the line circuit-breaker, which requires only four N-FETs T5, T6, T7 and T8, presupposes that the primary sense amplifier PV can be toggled into the new state merely by an L potential on the appropriate wire. If this presupposition is not met, then it is necessary to ensure that the line circuit-breaker LS transfers not just one but rather both opposite logic potentials from the two wires in the master data line to the wires in the local data line. This can be achieved by making an addition to the line circuit-breaker LS, as shown in dashes in FIG. 2.

The addition involves the channel of the N-FET T7 having the channel of a P-FET T9 connected in parallel with it whose gate is connected to the same point as the gate of the N-FET T7, and involves the channel of the N-FET T8 having the channel of a P-FET T10 connected in parallel with it whose gate is connected to the same point as the gate of the N-FET T8. Each parallel-connected transistor pair T7, T9 and T8, T10 forms, for the write mode, a transfer gate that can transfer both L potential and H potential. Hence, in all cases, the transfer of an H potential from an MD wire to an LD wire is also permitted. If, by way of example, the wire MDt is at L potential, then not only is this potential transferred to the wire LDt via the N-FET T8, but also the P-FET T10 turns on, which results in that it transfers the H potential from the wire MDc to the wire LDc. As a result of the transfer switch TS being on, this then causes the primary sense amplifier PV to toggle reliably into the correct state for writing the new data item.

The described control, activation and turn-on signals can be derived from the time signals from the time control device for the memory in combination with the address information. A block diagram of a control system suitable for this purpose is shown in the bottom part of FIG. 1.

The control system, denoted overall by 10, uses the word line decoder 11 receiving the row address, the column decoder 12 receiving the column address and the time control device 13. The word line decoder 11 activates the word line WL determined by the row address. A first control circuit 14 ascertains the addressed segment from the column address information and uses it to generate, under time control by the time control device 13, the activation signal SVA for the secondary sense amplifiers SV associated with this segment. A second control circuit 15 ascertains the addressed column subgroup from the column address information and uses it to generate, under time control by the time control device 13, the turn-on signal on the instance of the column selection lines that is associated with this subgroup. The control signal EQ1 for equalizing the local data lines LD and the bit lines BL, the control signal EQ2 for equalizing the master data lines MD, and the control signal PVA for the changeover switch PU (FIG. 2) for activating the primary sense amplifiers are generated directly by a time control device 13 (FIG. 1A).

The invention is naturally not limited to the exemplary embodiment of a digital memory circuit described with reference to the drawings, but can advantageously also be implemented for memory banks whose memory areas are not segmented. Since the inventive form of the line circuit-breakers allows boosted control voltages for selectively activating these switches to be dispensed with, a saving on current can be achieved in the case of unsegmented memory areas.

The number q of columns per subgroup can also be different than 4, e.g. 2 or even just 1. Preferably, q is an integer power of 2.

The invention is naturally also not limited to the situation in which the H potential is positive with respect to the L potential. In the converse situation, that is to say when H is negative with respect to L, P-FETs need to be used instead of the N-FETs, and N-FETs need to be used instead of the P-FETs.

For the sake of clarity, the switches BE, LE, ME and PU are shown as mechanical switches in FIGS. 1A, 1B and 2, although they are really electronic switching devices which are preferably formed by field effect transistors. These and also the field effect transistors T1 to T10 described above are preferably MOSFETs.

We claim:

1. A digital memory circuit, comprising:
    at least one memory bank containing at least two areas having a respective multiplicity of memory cells, disposed in a matrix form in rows and columns, for storing binary data;
    primary sense amplifiers, one of said primary sense amplifiers provided for each of said columns for sensing the binary data stored in an addressed memory cell;
    two-wire local data lines each having a first wire and a second wire;
    transfer switches, a respective transfer switch connected between a respective two-wire local data line and a respective primary sense amplifier, said respective transfer switch receiving and turned on by a column selection signal, said respective primary sense amplifier using said respective transfer switch to connect said first wire in said respective two-wire local data line to a first logic potential and to connect said second wire to a second logic potential when a sensed data item has a first binary value, and to connect said first wire to the second logic potential and to connect said second wire to the first logic potential when the sensed data item has a second binary value;
    two-wire master data lines each having a first wire and a second wire and associated with said respective two-line local data line for each of said areas of said memory bank;
    line circuit-breakers, a respective line circuit-breaker connected between said respective two-line local data line and a respective two-wire master data line;
    secondary sense amplifiers having inputs connected to said two-wire master data lines; and precharging devices connected to and temporarily equalizing said first and second wires in all of said two-wire local data lines to a potential situated between the first and second logic potentials and for temporarily equalizing said first and second wires in all of said two-line master data lines to the first logic potential before said transfer switches are turned on;

each of said line circuit-breakers containing switching devices for sensing electrical potentials appearing on said first and second wires in said respective two-wire local data line and in said respective two-wire master data line and, depending on a sensing result, if one of said first and second two wires of said respective two-wire local data line being at the second logic potential, said respective line circuit-breaker transfers the second logic potential to an associated one of said first and second wires of said two-wire master data line, and if one of said first and second wires of said respective two-line master data line being at the second logic potential, said respective two-line master data line transfers the second logic potential to an associated one of said first and second wires of said respective two-wire local data line.

2. The memory circuit according to claim 1, wherein said switching devices of each of said line circuit-breakers further comprising:

a first field effect transistor having a channel connected between said first wire of said respective two-line local data line and said first wire of said respective two-wire master data line and a gate connected to said second wire of said respective two-wire local data line;

a second field effect transistor having a channel connected between said second wire of said respective two-wire local data line and said second wire of said respective two-wire master data line and a gate connected to said first wire of said respective two-wire local data line;

a third field effect transistor having a channel connected between said first wire of said respective two-wire local data line and said first wire of said respective two-wire master data line and a gate connected to said second wire of said respective two-wire master data line; and a fourth field effect transistor having a channel connected between said second wire of said respective two-wire local data line and said second wire of said respective two-wire master data line and a gate connected to said first wire of said respective two-wire local data line, said first, second, third and fourth field effect transistors having a conductivity type such that said first, second, third and fourth field effect transistors transfer the second logic potential when said gate is at the first logic potential.

3. The memory circuit according to claim 1, wherein and depending on the sensing result, if one of said first and second wires of said respective two-wire master data line is at the first logic potential, said switching devices contained in each of said line circuit-breakers transfer the first logic potential to an associated one of said first and second wires of said respective two-line local data line.

4. The memory circuit according to claim 2, wherein said switching devices of each of said line circuit-breakers further comprising:

a fifth field effect transistor having a channel connected between said first wire of said respective two-wire local data line and said first wire of said respective two-line master data line and a gate connected to said second wire of said respective two-line master data line; and a sixth field effect transistor having a channel connected between said second wire of said respective two-wire local data line and said second wire of said respective two-wire master data line and a gate connected to said first wire of said respective two-wire master data line, said fifth and sixth field effect transistors being of a further conductivity type being opposite said conductivity type of said first, second, third, and fourth field effect transistors.

5. The memory circuit according to claim 1, wherein:

said columns in each of said areas of said memory bank form at least two adjacent groups, each of said at least two adjacent groups occupies a separate segment of a respective area;

each of said two-wire local data lines is associated with precisely one of said segments of precisely one area of said memory bank; and each of said two-line master data lines is associated with precisely one segment of each area of said memory bank.

* * * * *